United States Patent [19]

Holland

[11] 4,217,020
[45] Aug. 12, 1980

[54] ELECTRICAL DEVICE CONNECTIONS

[75] Inventor: Richard W. Holland, Los Gatos, Calif.

[73] Assignee: Fairchild Camera & Instrument Corp., Mountain View, Calif.

[21] Appl. No.: 960,510

[22] Filed: Nov. 13, 1978

[51] Int. Cl.³ .................... H01R 13/54; H01R 13/58; H05K 1/12

[52] U.S. Cl. .............................. 339/75 M; 339/17 C; 339/105

[58] Field of Search ............. 339/75 M, 75 MP, 75 R, 339/221 R, 103 R, 103 B, 105, 74 R, 95 R, 97 R, 174, 119 C, 17 C, 17 CF; 174/153 G; 24/131 R, 129 C, 129 A, 169, 170

[56] References Cited

U.S. PATENT DOCUMENTS

| 1,065,190 | 6/1913 | Tobin | 339/105 |
| 2,694,189 | 11/1954 | Wirsching | 339/103 R X |
| 4,062,617 | 12/1977 | Johnson | 339/75 M |
| 4,082,399 | 4/1978 | Barkhuff | 339/75 M |

FOREIGN PATENT DOCUMENTS 2621537 11/1976 Fed. Rep. of Germany ........ 339/17 C
1225806 2/1960 France ........................... 24/169

Primary Examiner—Roy Lake
Assistant Examiner—Eugene F. Desmond
Attorney, Agent, or Firm—Paul J. Winters; Ronald J. Meetin

[57] ABSTRACT

Two-point diagonally opposite electrical connection between the surface area forming a lead-receiving hole of one electrical device and the corresponding resilient lead of another electrical device is maintained by an eccentric pin inserted into holes in the two devices.

An electrically conductive spring for interconnecting lead lines on a printed circuit board comprises a resilient main body for insertion into a hole in the printed circuit board, retaining protrusions integral with the main body for keeping it in the hole, and resilient arms extending outward from the main body for contacting selected lead lines.

An electrical cord is anchored to a stiff sheet using a cantilevered door continuous with the sheet, the door opening having a notch for receiving the cord and, in association with the door, for holding the cord as it passes through the door opening.

10 Claims, 33 Drawing Figures

UNANCHORED POSITION

ANCHORED POSITION

ANCHORED POSITION

ELECTRICAL DEVICE CONNECTIONS

BACKGROUND OF THE INVENTION

1. Field of the Invention

This invention relates generally to electrical device connections. In one aspect, this invention relates particularly to methods and devices for making electrical connections between individual electrical devices. In a second aspect, this invention relates particularly to devices for electrically interconnecting conductive lead lines on printed circuit boards. In a third aspect, this invention relates particularly to structures for anchoring electrical cords.

2. Description of the Prior Art

A

In the semiconductor prior art, electrical connections between a packaged integrated circuit having one or more resilient electrical leads extending from the packaged integrated circuit and a printed circuit board having a corresponding number of lead-receiving holes in the printed circuit pattern for receiving the electrical leads have usually been made in one of two ways.

In one method, electrical leads extending from the packaged integrated circuit are inserted into lead-receiving holes in the printed circuit board and then soldered to the printed circuit board. Referring to the drawings, FIGS. 1a and 1b show this connective device using a rectangular-shaped (dual-in-line) packaged integrated circuit 20. Note that the actual semiconductor chip containing the integrated circuit components is located within packaged integrated circuit 20. FIGS. 1a and 1b show only the package for the semiconductor chip. To facilitate the discussion, references to an integrated circuit as being in a package will generally be dropped hereinafter. That is, a "packaged" integrated circuit will generally be referred to simply as an integrated circuit.

Integrated circuit 20 has two rows of electrical leads 22 extending outward from the sides of integrated circuit 20 and then bending downward. Leads 22 are inserted through the lead-receiving holes 24 in a printed circuit board 26. The free ends of leads 22 are then soldered to the bottom of printed circuit board 26 at points 28. In this example, electrically conductive lead lines forming the printed circuit pattern 30 on the bottom surface of printed circuit board 26 electrically connect to solder points 28 on the bottom of printed circuit board 26. Solder connections 28 and printed circuit pattern 30 could as well be located on the top of printed circuit board 26.

In the other prior art method, a socket is used as an intermediate connective device between an integrated circuit and a printed circuit board. As indicated in FIG. 2, resilient leads 22 of a rectangular packaged integrated circuit 20 are inserted into the socket holes 32 of a socket 34. In inserting leads 22 into socket holes 32, frictional forces are generated between leads 22 and the interior walls of socket holes 32. The frictional forces act to keep leads 22 in socket holes 32. Socket 34 has socket leads 36 extending downward from socket 34. Within socket 34, socket leads 36 extend upward to physically contact electrical leads 22 extending from integrated circuit 20. Socket leads 36 are inserted into lead-receiving holes 24 on printed circuit board 26 and soldered to printed circuit board 26. The solder connections, which are not shown in FIG. 2, connect to a printed circuit pattern, which is also not shown, as in the first connection method.

The first connection method in the prior art requires that electrical leads 22 be soldered to printed circuit board 26. Soldering takes a substantial amount of fabrication time. In addition, since leads 22 are soldered to printed circuit board 26, integrated circuit 20 cannot be easily separated from printed circuit board 26.

Similarly, the second prior art method requires time-consuming soldering. Because socket 34 is used as an intermediate connective device, it is possible to separate integrated circuit 20 from printed circuit board 26 without much difficulty. Replacement of components is facilitated. However, use of socket 34 in the second method causes the amount of utilized space to nearly double. In semiconductor applications where the amount of utilized space is critical, this is highly disadvantageous.

In the semiconductor prior art, a connection between two printed circuit boards of the type illustrated in FIGS. 1a and 1b is generally made by soldering one end of a non-resilient lead to one of the printed circuit boards and soldering the other end of the non-resilient lead to the other printed circuit board. Non-resilient leads used in this application are typically made of copper.

As with the methods in the prior art for making connections between an integrated circuit and a printed circuit board, a disadvantage of the prior art technique for making a connection between two printed circuit boards is that soldering is unduly time consuming. In addition, use of soldering does not permit one printed circuit board to be easily separated from another printed circuit board.

D

Heretofore, electrical connections between electrical wires and electrically conductive plates have been made in a number of ways. In one type of electrical connection, an inner electrical conductor of an electrical wire is soldered to a copper plate. A substantial amount of time and expense are involved in making this type of connection. In addition, soldered connections occassionally break.

In another type of electrical connection used with telephone wires, a slit is formed in a copper plate and a telephone wire is urged into the slit until an inner electrical conductor in the wire contacts the plate. Typically, the edge surfaces of the slit penetrate through a break in the electrically insulating outer covering of the wire to make the electrical contact. A disadvantage of this connection is that undesirably high stresses are created in the wire in the vicinity of electrical contact.

SUMMARY OF THE INVENTION

A

In accordance with an embodiment of the present invention, electrical connection between two electrical devices in which one of the devices has a pattern of electrically conductive lead lines thereon and in which the second device has one or more resilient electrical leads extending outward therefrom is achieved by forming a corresponding number of lead-receiving holes larger in cross-section than the free end or ends of the lead or leads through selected parts of the lead-in pattern and into the first device, inserting the lead or leads into the appropriate lead-receiving hole or holes, orienting the section or sections of the lead or leads within the hole or holes so that each lead contacts the surface area forming the corresponding hole at surface portions spaced apart and located approximately diagonally opposite from each other with respect to the corresponding hole, and rigidly pinning the two devices together mechanically to maintain the orientation. Where neither of the specified surface portions of the surface area forming each hole contacts the corresponding lead directly, electrically conductive material is selectively deposited on the first device to connect at least one of these surface portions to the corresponding lead.

The present invention is particularly useful in connecting a conventional packaged integrated circuit to a printed circuit board. In making such a connection, pinning may be accomplished with a pinning instrument such as a simple straight pin, a screw, or a bolt extending from the printed circuit board to the integrated circuit. Alternatively, pinning of the printed circuit board to the integrated circuit may be effected simultaneously with appropriate orientation of the leads by using an eccentric pin extending between the printed circuit board and the integrated circuit.

The invention may also be utilized in connecting two printed circuit boards to each other. In this application, a yoke having one or more electrical leads passing therethrough is utilized. One free end of each lead extending from the yoke is inserted into one of the circuit boards, and the other free end of each lead extending from the yoke is inserted into the other printed circuit board. The free ends of the leads are then oriented as described above, and the printed circuit boards are pinned to each other mechanically to maintain the orientations.

An advantage of the present invention is that soldering is eliminated in connecting two electrical devices—e.g., a printed circuit board and either an integrated circuit or another printed circuit board—to each other. Electrical connections are accomplished by mechanically causing the desired connection areas to touch one another. The time spent in soldering is thereby saved.

Another advantage of the present invention over devices whose leads are directly soldered together is that a defective electrical device can be more easily replaced. Since no soldering is used, it is not necessary to remove the soldered connections. A defective device can be replaced by simply releasing the pin, removing the defective device, inserting a new electrical device, and then pinning the new device in place.

In comparison with semiconductor connections in which sockets are used as intermediate connective devices, only about half the space utilized in making the socketed connection is employed in the connections of the present invention. At the same time, the present invention offers the easy replacement capability of the socketed connections.

B

In accordance with an embodiment of this invention, two or more electrically conductive lead lines of the printed circuit pattern on a printed circuit board are electrically interconnected with an electrically conductive spring comprising an electrically conductive resilient main body for insertion into a hole passing through the thickness of the printed circuit board, retaining means for keeping the main body from being removed from the hole, and a plurality of electrically conductive resilient arms joined to the main body and extending outward from the main body for contacting selected lead lines of the printed circuit pattern. The spring may be made from a metal or other electrically conductive material.

In a preferred embodiment, the retaining means are retaining protrusions integral with the main body. The retaining protrusions contact the printed circuit board on the lower side—i.e., the side opposite to that where the printed circuit pattern is located. Although the arms and main body are described as separate elements, they may be fabricated with the retaining means in a unitary construction. Typically, the arms are joined to the main body near its top and pass above the upper side of the printed circuit board—i.e., the side of the printed circuit board having the printed circuit pattern.

Directional adjectives and nouns such as "lower", "upper", and "top" are used solely for describing the invention with respect to a printed circuit board lying flat as viewed from the side and having the printed circuit pattern on the upper surface. The printed circuit board could be oriented differently, in which case other appropriate directional adjectives and nouns would apply.

In one embodiment, the main body has a plurality of curved electrically conductive plate sections corresponding in number to the number of arms. The plate sections are spaced apart and generally arranged in a cylindrical pattern. Each plate section is joined along its lower edge to a corresponding curved electrically conductive retaining protrusion along its upper edge. Each retaining protrusion extends radially outward beyond the corresponding plate. The retaining protrusions are joined along their lower edges to a bowl-shaped electrically conductive resilient bottom. Each of the arms comprises an electrically conductive resilient flange generally oriented in the radial direction with respect to the cylindrical pattern and joined near the outer-most edge of the flange to a corresponding electrically conductive contact member. Each arm is joined to the main body by joining the flange along its inner-most edge to the corresponding plate section along its upper edge.

To use the invention, the main body of the spring is first compressed so that the main body can be fitted through the hole in the printed circuit board. The main body is entered into the hole on the upper side of the printed circuit board and moved through the hole until the retaining means come out on the lower side of the printed circuit board. The inner-most edges of the arms are adjacent to the edges of the hole on the upper side of the printed circuit board.

The spring is then rotated to such an orientation that portions of the arms contact selected lead lines, thereby effecting electrical interconnection of portions of the printed circuit pattern. The main body of the spring can be rotated to effect disconnection as desired. Alternatively, the main body can be rotated to a selected new orientation to effect a new electrical interconnection of portions of the printed circuit pattern.

An advantage of this invention is that it is more flexible than the prior art techniques in which selected lead lines of a printed circuit pattern are interconnected by making appropriate deposits of electrically conductive material on the printed circuit board. In these prior art techniques, the printed circuit board may be damaged in effecting disconnection. By rotating the spring of the present invention, the interconnections can be readily broken without causing damage to the printed circuit board. New interconnections can be easily made on the printed circuit board.

The present invention can be fabricated simply as a one-piece metal spring. It reduces costs in making electrical interconnections as contrasted to some of the prior art techniques.

C

In accordance with an embodiment of the present invention, an electrical cord is anchored to a stiff sheet using a cantilevered door formed in the sheet and continuous with the sheet at a first door edge. The first door edge is a pivotal axis around which the door can rotate. The door opening through which the cord passes is larger in area than the transverse cross-sectional area of the cord. A notch particularly designed for receiving the cord is formed in the door-opening edge which, when the door is closed, is adjacent to a second door edge located generally opposite the pivotal axis. Interfering means, which are integrally formed with the door and with the sheet, prevent the door from rotating all the way through the door opening. The door therefore opens only to one side of the sheet. Friction means are integrally formed with the door and with the sheet in the notch. When the door is closed, with a portion of the cord lying in the notch, the friction means act to anchor the cord to the sheet relative to pulling forces exerted on the cord from the other side of the sheet.

Typically, the sheet and integral cantilevered door are made of plastic. Conventional plastic molding techniques may be utilized in fabricating the anchoring structure.

The invention is employed by passing the cord through the door opening and appropriately aligning the portion of the cord at which anchoring is desired in the notch. The door is then closed so that the friction means engage and anchor the cord.

An advantage of the present anchoring structure is that it may be made in a single piece in contrast to prior art anchoring structures which are made in several parts. The present structure thus avoids the additional time needed for assembling the extra parts of the prior art structures. In terms of space consumed, the invention is economical since it employs little space beyond that necessary for the sheet and cord themselves.

D

In accordance with an embodiment of this invention, an inner electrical conductor of an electrical wire having an electrically insulating outer covering is electrically connected at a first position on the wire to an electrically conductive body at a slit formed in a surface of the body where a portion of the material forming the slit penetrates through the outer covering to make electrical contact with the inner conductor of the wire. A holding mechanism on the body grips the outer covering at a second position on the wire to relieve stresses in the wire that result from the electrical contact. The holding mechanism is typically formed integrally with the body.

An advantage of this invention is that the use of solder to make electrical connections is obviated. The present structure for effecting electrical connection of an electrical wire can be installed in less time and at lower cost than prior art soldered connections. In contrast to prior art structures in which a telephone wire is electrically connected to an electrically conductive plate at a slit in the plate, the present invention additionally provides a simple method for stress relief that does not exist in the prior art telephone-wire structures.

Figure 1A:
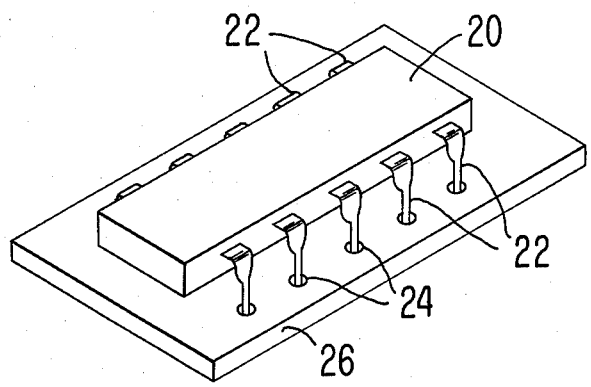
FIGS. 1a and 1b are perspective views seen from above and from below, respectively, illustrating typical electrical connections in the prior art between a conventional rectangular packaged integrated circuit and a printed circuit board.
Figure 2:
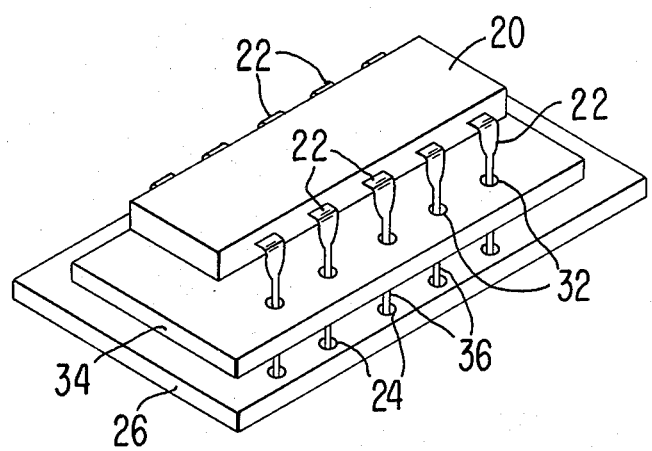
FIG. 2 is a perspective view of a prior art electrical connection between a conventional rectangular packaged integrated circuit and a printed circuit board in which a socket is utilized as an intermediate connective device.

The plane or planes through which cross-sectional views are taken generally are indicated by arrows referencing the figure numbers of the cross-sectional views.

Like reference numbers are employed in the drawings to represent the same item or items in the drawings and in the description of the preferred embodiments.

DESCRIPTION OF THE PREFERRED EMBODIMENTS

A

Figure 3A:
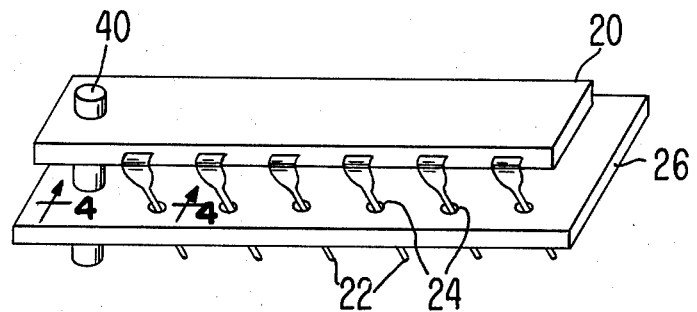
FIGS. 3a, 3b, and 3c show perspective, side, and top views of one embodiment of the present invention in which a standard straight pin is used in effecting electrical connection between a rectangular packaged integrated circuit and a printed circuit board.
Figure 3B:
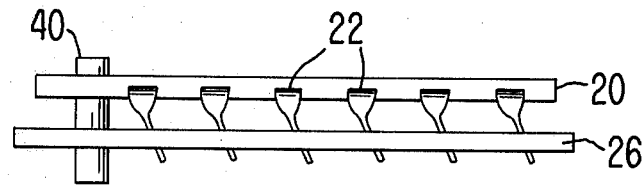
Figure 3C:
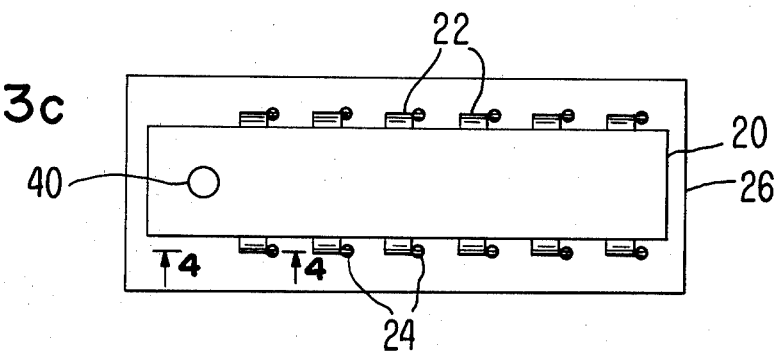

Referring to the drawings, FIGS. 3a, 3b, and 3c show perspective, side, and top views of a basic embodiment of the present invention for making electrical connection between two electrical devices. In this embodiment, a conventional rectangular (dual-in-line) packaged integrated circuit 20 is utilized. As stated previously, a "packaged" integrated circuit will generally be described simply as an integrated circuit.

Two rows of resilient electrical leads 22 extend outward and then downward from integrated circuit 20. Resilient leads 22 are typically made of a ferrous material. For example, leads 22 may be fabricated from a nickel-plated mild carbon steel such as SAE 1020.

Figure 1B:
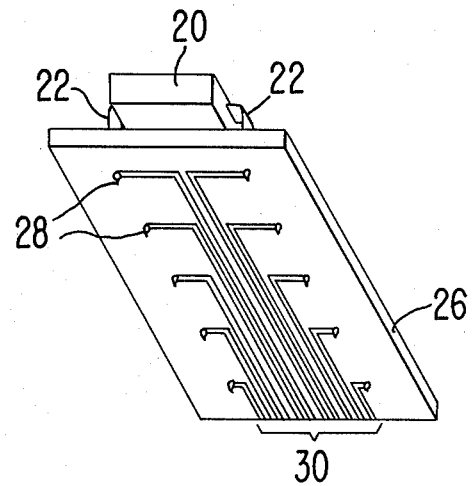

A plurality of lead-receiving holes 24, corresponding in numbers to the number of leads 22, are formed in a printed circuit board 26 generally in the orthogonal direction—i.e., in the direction orthogonal to the upper surface of printed circuit board 26. Holes 24 are generally larger in cross-section than the free ends of leads 22. Printed circuit board 26 has a printed circuit pattern on either its top surface or its bottom surface of the type previously shown in FIG. 1b. Each of the holes 24 abuts or nearly abuts an appropriate electrically conductive portion of the printed circuit pattern. The individual parts of the printed circuit pattern may be referred to as electrically conductive lead lines.

To effect electrical connection between leads 22 and the printed circuit pattern on printed circuit board 26, each lead 22 is first inserted into its corresponding hole 24. Leads 22 then are all bent or deflected in such a manner that the section of each lead 22 within its corresponding hole 24 contacts the surface area forming corresponding hole 24 in printed circuit board 26 at surface portions of corresponding hole 24 that are spaced apart and diagonally opposite from each other as viewed from a longitudinal side of integrated circuit 22. In this embodiment, leads 22 are deflected in vertical planes along the length of integrated circuit 20. The deflected orientation of the sections of leads 22 within holes 24 is maintained by mechanically pinning integrated circuit 20 rigidly to printed circuit board 26 with a conventional straight pin 40.

Figure 4:
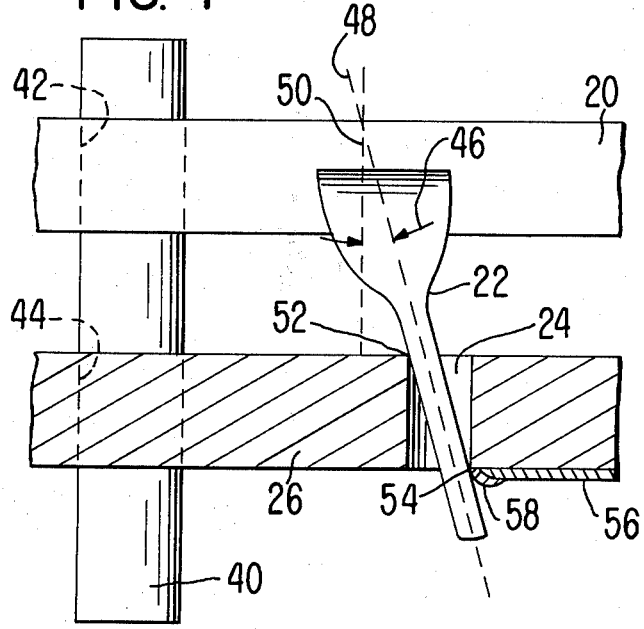
FIG. 4 is an expanded cross-sectional side view of the embodiment of FIG. 3b showing details of the electrical connections between an integrated circuit lead and the printed circuit board.

FIG. 4 shows an expanded cross-sectional side view of the details for appropriately orienting a lead 22 within its corresponding hole 24 and for pinning integrated circuit 20 to printed circuit board 26. In this embodiment, a hole 42 of approximately the same cross sectional area as pin 40 is formed through integrated circuit 20 generally in the orthogonal direction as depicted in FIG. 4. Likewise, a hole 44 of approximately the same cross sectional area as pin 40 is formed through printed circuit board 26 generally in the orthogonal direction. Pin 40 is inserted through holes 42 and 44 to pin integrated circuit 20 and printed circuit board 26 to each other rigidly.

Each lead 22 is deflected so that there is an angle 46 between the center line 48 of lead 22 and the vertical line 50. When lead 22 is so deflected, the section of lead 22 within hole 24 contacts the surface area of printed circuit board 26 forming hole 24 at two surface portions approximately indicated by items 52 and 54. In FIG. 4, items 52 and 54 are depicted as point contacts. However, the actual contacts between lead 22 and the surface area forming hole 24 are made over small but finite surface areas. That is, a surface area portion of lead 22 near point 52 contacts a portion of the surface area forming hole 24 near point 52. Likewise, a portion of the surface area of lead 22 near point 54, which is approximately diagonally opposite point 52, contacts a corresponding portion of the surface area forming hole 24 near point 54.

The surface area vectors of these two portions of the surface area forming hole 24 generally point in opposite directions. Note that the vector of a surface area is mathematically defined as pointing in a direction perpendicular to and outward from the surface area. Accordingly, the portion of the surface area forming hole 24 near point 52 may be described as spaced apart from and generally opposed in vector direction to the portion of the surface area forming hole 24 near point 54.

An electrically conductive lead line 56 of a printed circuit pattern on the bottom surface of printed circuit board 26 extends approximately up to the edges of hole 24 in the vicinity of point 54. In some embodiments, lead line 56 extends so close to point 54 that when lead 22 is deflected, electrical connection is made between lead 22 and lead line 56.

In other embodiments, lead line 56 may not extend so close to point 54 that electrical contact is made between lead 22 and lead line 56 when lead 22 is appropriately deflected. In this case, electrically conductive material 58 is deposited on printed circuit board 26 over a portion of the surface area forming hole 24 near point 54 and up to lead line 56 to effect electrical connection between lead 22 and lead line 56. Typically, electrically conductive material 58 is copper.

Figure 5:
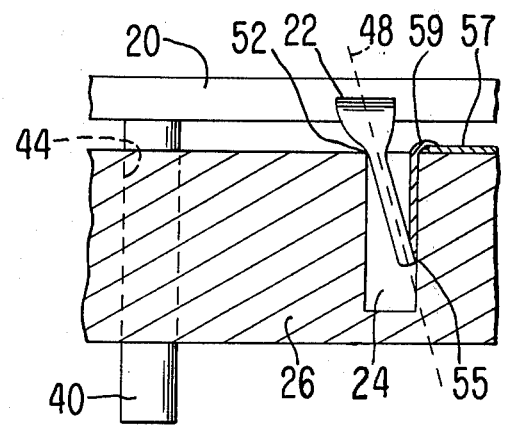
FIG. 5 is a cross-sectional side view showing details of alternative ways for making electrical connections between an integrated circuit lead and a printed circuit board.

FIG. 5 shows a side view of alternative ways for rigidly mechanically pinning integrated circuit 20 to printed circuit board 26 and for appropriately orienting the section of lead 22 within corresponding hole 24. As illustrated in FIG. 5, pin 40 may be formed as integral part of integrated circuit 20. Numerous alternative types of pinning instruments and mechanisms may be utilized. For example, a pin of square cross-sectional shape or of any other desired cross-sectional shape may be utilized in lieu of pin 40 of circular cross-section depicted in FIGS. 3a and 3c. Screws or bolts may be employed as pinning instruments. The pinning instruments are fabricated from metals, such as iron or aluminum alloys, or from other compatible materials according to conventional manufacturing techniques.

As indicated in FIG. 5, lead 22 may not pass all the way through printed circuit board 26 in some embodiments. In this situation, lead 22 contacts the surface area forming hole 24 in the vicinity of a point 55 located within the boundaries of hole 24, rather than at the edges of hole 24. Furthermore, hole 24 need not pass all the way through printed circuit board 26.

Where lead 22 does not pass all the way through printed circuit board 26, electrical connection to a printed circuit pattern on the top surface of printed circuit board 26 may be made in the manner described for FIG. 4. Alternatively, electrical connection between an electrically conductive lead line 57 on the top surface of printed circuit board 26 may be made to lead 22 at point 55 by depositing electrically conductive material 59 over a selected portion of the surface area forming hole 24 near point 55 and up to lead line 57.

Previously it was stated that holes 24 are generally larger in cross-section than leads 22. More precisely, each hole 24 is formed with a cross-sectional area greater than the cross-sectional area of the widest portion of the section of corresponding lead 22 which is later inserted into hole 24.

Figure 6:
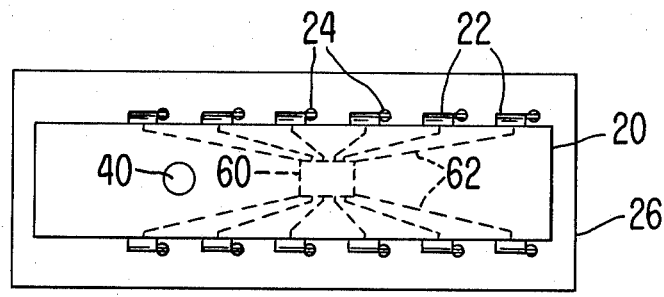
FIG. 6 is a top view of the electrical connections between a rectangular packaged integrated circuit and a printed circuit board showing an alternative pin location to that shown in FIG. 3c.

FIG. 6 shows a top view indicating by dashed lines the location of the actual semiconductor chip 60 within rectangular packaged integrated circuit 20. Dashed lines 62 indicate the locations of the chip leads within integrated circuit 20 connecting semiconductor chip 60 to resilient electrical leads 22. As shown in FIG. 6, pin 40 may be inserted through integrated circuit 20 at a plane within the general confines of leads 22 without causing damage to semiconductor chip 60 within integrated circuit 20 rather than outside the general confines of leads 22 as in the previous figures.

Figure 7A:
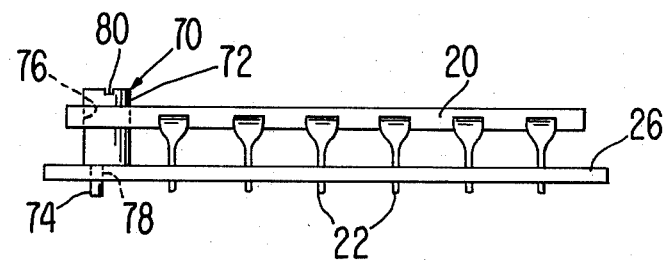
FIGS. 7a and 7b are side views of an embodiment of this invention in the undeflected position and in the deflected position, respectively, in which an eccentric pin is utilized in effecting electrical connection between a rectangular packaged integrated circuit and a printed circuit board.
Figure 7B:
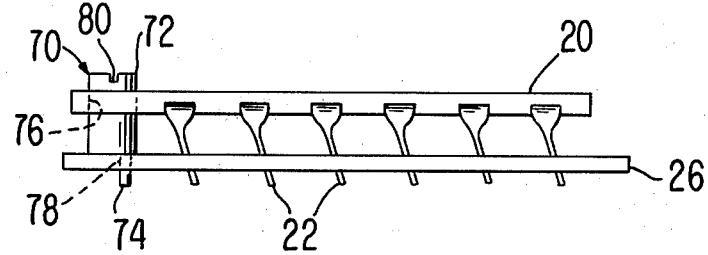

FIGS. 7a and 7b show side views of an embodiment of the present invention wherein an eccentric pin 70 is employed to orient leads 22 appropriately to effect electrical connection between integrated circuit 20 and printed circuit board 26.

Figure 8A:
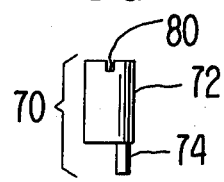
FIGS. 8a and 8b are side and perspective views of the eccentric pin used in the embodiment of FIGS. 7a and 7b.
Figure 8B:
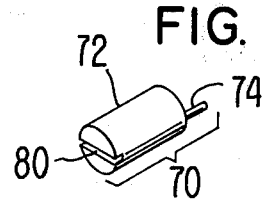

FIGS. 8a and 8b show side and perspective views of eccentric pin 70 employed in FIGS. 7a and 7b. Eccentric pin 70 has a wide portion 72 joined to a narrow portion 74 which is circularly offset from wide portion 72. Wide portion 72 passes through a hole 76 in integrated circuit 20. Likewise, narrow portion 74 passes through a hole 78 in printed circuit board 26. Eccentric pin 70 has a crevice 80 in the upper surface of wide portion 72 for enabling eccentric pin 70 to be turned with a screwdriver or similar instrument.

In the undeflected position shown in FIG. 7a, leads 22 are initially aligned generally in the orthogonal direction as eccentric pin 70 is inserted into holes 76 and 78. Eccentric pin 70 is then rotated to achieve the desired deflected orientation as shown in FIG. 7b of the sections of leads 22 within holes 24 and to complete rigid mechanical pinning of integrated circuit 20 to printed circuit board 26.

Figure 9A:
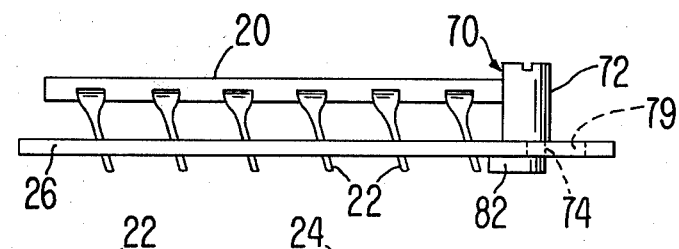
FIGS. 9a and 9b are side and top views of an embodiment for electrically connecting a rectangular packaged integrated circuit to a printed circuit board utilizing an eccentric pin in an alternative location from that shown in FIGS. 7a and 7b.
Figure 9B:
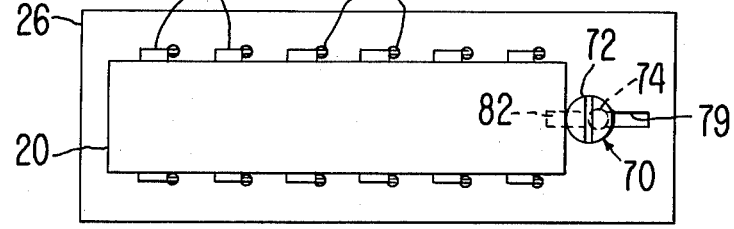

FIGS. 9a and 9b show side and top views of an alternative embodiment in which eccentric pin 70 is employed. In this embodiment, eccentric pin 70 presses against an end of integrated circuit 20 rather than passing through a hole in integrated circuit 20. Operation is otherwise similar to that described for the embodiment of FIGS. 7a and 7b.

FIGS. 9a and 9b also indicate an alternative shape for eccentric pin 70. In this example, eccentric pin 70 has a locking member 82 joined to narrow portion 74. After being inserted through hole 79 along with narrow portion 74, locking member 82 acts to lock eccentric pin 70 to printed circuit board 26. Locking mechanism, such as locking member 82, may as well be used with other pinning mechanisms and instruments described herein.

Figure 10A:
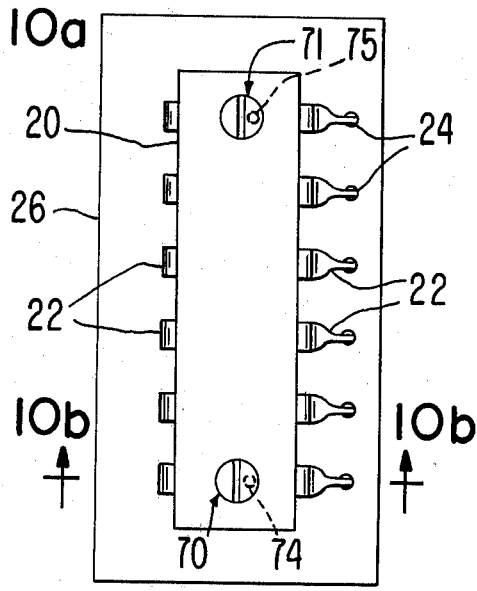
FIGS. 10a and 10b are top and end views of an embodiment employing two eccentric pins in effecting electrical connection between a rectangular packaged integrated circuit and a printed circuit board.
Figure 10B:
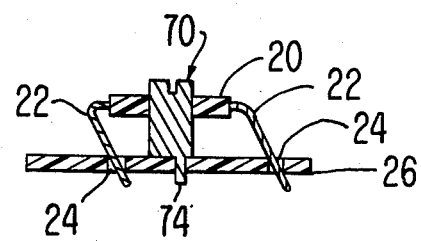

FIGS. 10a and 10b show top and end views of an embodiment in which electrical connection between integrated circuit 20 and printed circuit board 26 is effected by utilizing two or more pins to deflect leads 22 in planes along the width of rectangular packaged integrated circuit 20 rather than in planes along the length of integrated circuit 20 as shown for previous embodiments. In this example, two eccentric pins 70 and 71 are utilized. Dashed lines 74 and 75 indicate the locations of the narrow portions of eccentric pins 70 and 71. Other types of pins or pinning mechanisms may be employed to achieve the orientation necessary for effecting the electrical connections depicted in FIGS. 10 and 10b.

Figure 11A:
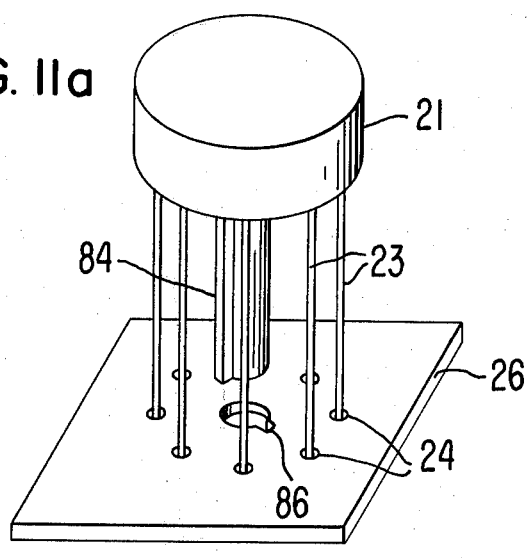
FIGS. 11a and 11b are perspective views of an embodiment in the undeflected position and in the deflected position, respectively, in which a circular packaged integrated circuit is electrically connected to a printed circuit board through use of a key-shaped pin.
Figure 11B:
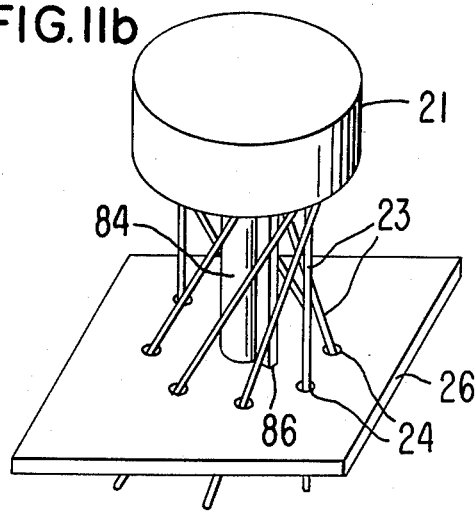

FIGS. 11a and 11b show perspective views in which the present invention is utilized in electrically connecting a conventional circular packaged integrated circuit 21 to printed circuit board 26. Circular packaged integrated circuit 21 has a plurality of resilient electrical leads 23 arranged in a circular pattern and extending generally downward from circular integrated circuit 21. Leads 23 are made from an iron alloy termed covar. Integrated circuit 21 has a key-shaped straight pin 84 extending downward from the bottom of circular integrated circuit 21. Printed circuit board 26 has a corresponding key-shaped hole 86. In the undeflected position shown in FIG. 11a, key-shaped pin 84 is not aligned with key-shaped hole 86. Leads 23 are inserted into lead-receiving holes 24 formed in printed circuit board 26. As shown in FIG. 11b, circular integrated circuit 21 is rotated so that the sections of leads 23 in holes 24 are appropriately deflected and key-shaped pin 84 is aligned with key-shaped hole 86. Key-shaped pin 84 is then inserted into key-shaped hole 86 to effect the electrical connections and to rigidly pin circular integrated circuit 21 to printed circuit board 26.

Figure 12A:
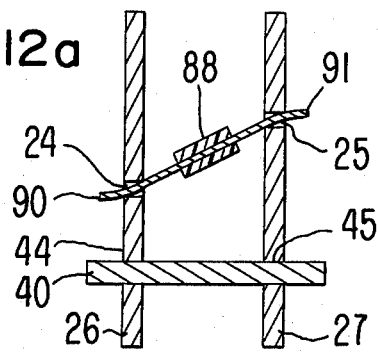
FIGS. 12a and 12b are cross-sectional side and top views of an embodiment of the present invention in which a mechanical pin and a yoke are utilized in effecting electrical connection between two printed circuit boards.
Figure 12B:
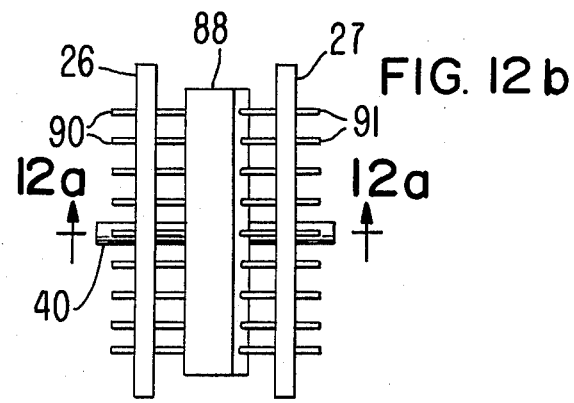

FIGS. 12a and 12b depict side and top views illustrating how the present invention is utilized to connect electrically the printed circuit patterns on two printed circuit boards 26 and 27 to each other. Yoke 88 between printed circuit boards 26 and 27 has one or more resilient electrical leads passing entirely through yoke 88. The leads extending from one side of the yoke 88 are denoted as items 90, and the leads extending from the other side of yoke 88 are denoted as items 91. Leads 90 are inserted into holes 24 in printed circuit board 26, and leads 91 are inserted into holes 25 in printed circuit board 27. Leads 90 and 91 are deflected in the manner previously described to achieve electrical connection between the appropriate parts of printed circuit boards 26 and 27. Pin 40 is inserted through hole 44 in printed circuit board 26 and through hole 45 in printed circuit board 27 to maintain the desired orientation. Resilient leads 90 and 91 are typically made of a ferrous material such as SAE 1020. Alternatively, leads 90 and 91 may be fabricated from spring brass.

In correlating the embodiment shown in FIGS. 12a and 12b to the previous discussion of the present invention, printed circuit board 26 is viewed as one electrical device. Printed circuit board 27, yoke 88, and resilient electrical leads 91 are viewed as another electrical device.

B

Figure 13A:
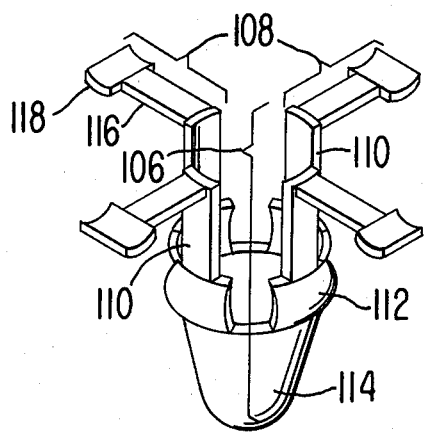
FIGS. 13a, 13b, and 13c are cross-sectional perspective, regular perspective, and cross-sectional side views, respectively of an embodiment of a metal spring for electrically interconnecting electrically conductive lead lines of a printed circuit pattern on a printed circuit board.
Figure 13B:
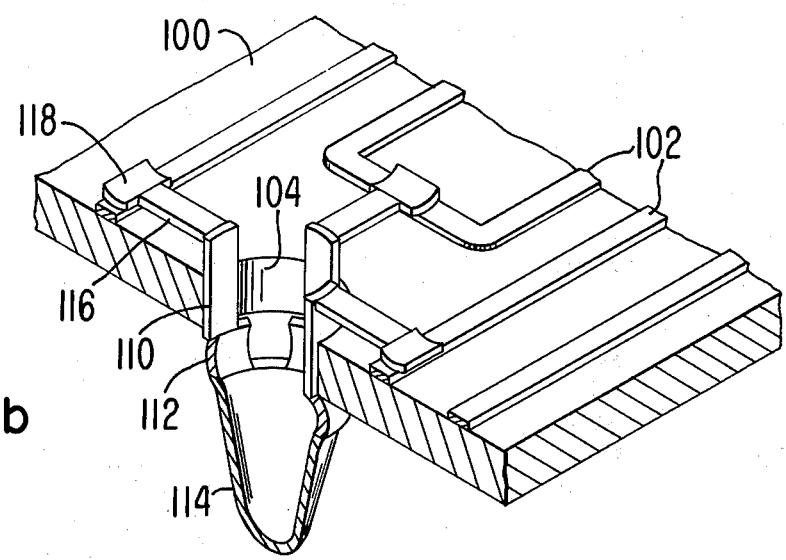
Figure 13C:
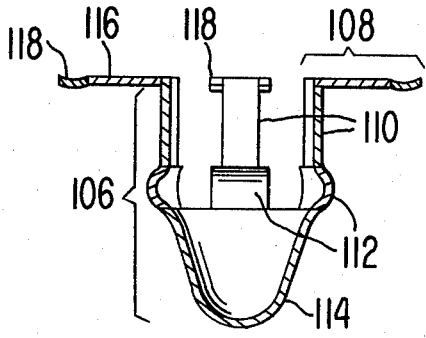

Referring to the drawings, FIGS. 13a, 13b, and 13c show cross-sectional perspective, regular perspective and cross-sectional side views of an embodiment of a metal spring used for electrically interconnecting electrically conductive lead lines of a printed circuit pattern on a printed circuit board. As shown in FIG. 13a, a printed circuit board 100 has electrically conductive lead lines 102 on its upper surface and a hole 104 passing through the thickness of printed circuit board 100. Typically, hole 104 is cylindrical and may be made through conventional drilling.

The metal spring has an electrically conductive main body 106 which is inserted into hole 104 and a plurality of electrically conductive resilient arms 108 which are joined to main body 106 and extend outward to contact selected lead lines 102 of the printed circuit pattern. Integrally formed with main body 106 are retaining means for keeping main body 106 from being removed from hole 104.

Main body 106 has a plurality of electrically conductive plate sections 110 corresponding in number to the number of arms 108. Plate sections 110 are spaced apart and generally arranged in a cylindrical pattern. Each plate section 110 is generally of a rectangular shape and has a circular curvature. The radius of curvature of each plate section 110 is approximately equal to the radius of curvature of hole 104. When main body 106 is inserted into hole 104, the convex (or outer) surface of each plate section 110 lies adjacent to a portion of the surface of printed circuit board 100 forming hole 104.

Joined to plate sections 110 along their bottom edges and forming parts of main body 106 are a like number of electrically conductive retaining protrusions 112. Each plate section 110 is joined to the corresponding retaining protrusion 112 along the upper edge of retaining protrusion 112. Retaining protrusions 112 have a general circular curvature akin to the curvature of plate sections 110 and bulge radially outward with respect to the cylindrical pattern beyond plate sections 110. When main body 106 is inserted into hole 104, retaining protrusions 112 generally abut the bottom surface of printed circuit board 100, thereby acting to keep the metal spring in place.

Also forming part of main body 106 is a bowl-shaped electrically conductive resilient bottom 114. Bottom 114 is joined along its upper (and sole) edge to retaining protrusions 112 along their lower edges. While bottom 114 has been described as bowl-shaped, bottom 114 may also be formed in triangular, rectangular, or other appropriate shapes.

Although body 106 has been described as being fabricated using discrete elements, plates sections 110, retaining protrusions 112, and bottom 114 may all be fabricated in a unitary construction.

In the embodiment shown in FIGS. 13a, 13b, and 13c, each arm 108 comprises an electrically conductive resilient flange 116 oriented generally in a radial direction with respect to the cylindrical pattern and an electrically conductive contact member 118 joined to the corresponding flange 116 near its outer-most edge. Arm 108 is joined to main body 106 by joining flange 116 along its inner-most edge to the corresponding plate section 110 along its upper edge. Each flange 116 and its corresponding plate section 110 may be formed in a unitary construction.

Contact members 118 are curved slightly such that their bottom surfaces lie lower with respect to printed circuit board 100 than the lower surfaces of flanges 116. Thus, when main body 106 is inserted into hole 104, contact members 118 touch selected lead lines 102 of the printed circuit pattern. The inner-most lower edges of flanges 116 may touch portions of printed circuit board 100 near hole 104, but the remainders of the flanges 116 lie above the top surface of printed circuit board 100. Therefore, electrical contact to lead lines 102 is made only through contact members 118.

Whereas main body 106 and arms 108 have been described as separate elements, main body 106 and arms 108 may be fabricated integrally from a single piece of metal according to conventional manufacturing techniques. Either spring brass or a ferrous material such as SAE 1020 may be employed in manufacturing main body 106 and arms 108 of the metal spring.

Figure 14:
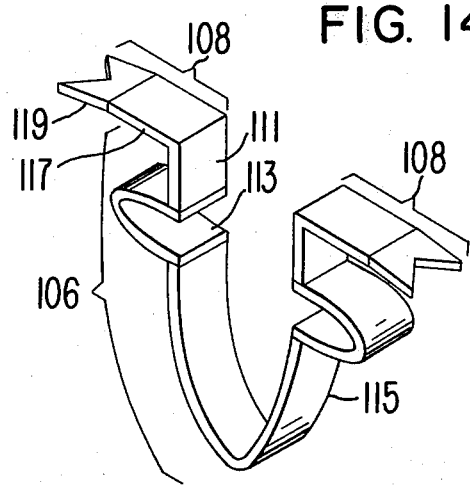
FIG. 14 is a perspective view of another embodiment of a metal spring for electrically connecting lead lines of a printed circuit pattern on a printed circuit board.

FIG. 14 shows a perspective view of an alternative embodiment of the metal spring for electrically connecting conductive lead lines on a printed circuit board. In this embodiment, the metal spring is formed from a single strip of metal. The ends of the metal strip are shaped to form a pair of arms 108. Each arm 108 comprises a flange 117 of a generally rectangular shape and extending radially outward with respect to main body 106 and a contact member 119 extending from the outer-most edge of corresponding flange 117. Each contact member 119 is a flat plate that bends slightly downward and has a V-shaped notch cut in its outer-most edge to facilitate contact with lead lines of a printed circuit board. Main body 106 is formed from the central portion of the metal strip. Main body 106 has a pair of plate sections 111 which are generally at right angles to flanges 117 of arms 108. Each plate 111 is generally rectangular in shape. Formed extending from the lower edge of each plate 111 is a corresponding retaining protrusion 113. Retaining protrusion 113 is generally in the shape of a sideways "U" with the circular portion of the "U" extending radially outward beyond plate section 111. Formed on the lower edges of retaining protrusions 113 is bottom 115 generally shaped in the form of an upright "U."

In the embodiments of this invention, two types of contact members 118 and 119 have been described. Other types and geometries of contact members which effect electrical contact with selected lead lines on a printed circuit board in the manner described for contacts 118 and 119 may also be utilized in accordance with this invention. Likewise, the bottom to main body 106 may be formed in various shapes other than a bowl and a "U". Furthermore, in some embodiments the retaining protrusions may be joined to one another along some or all their side edges.

C

Figure 15A:
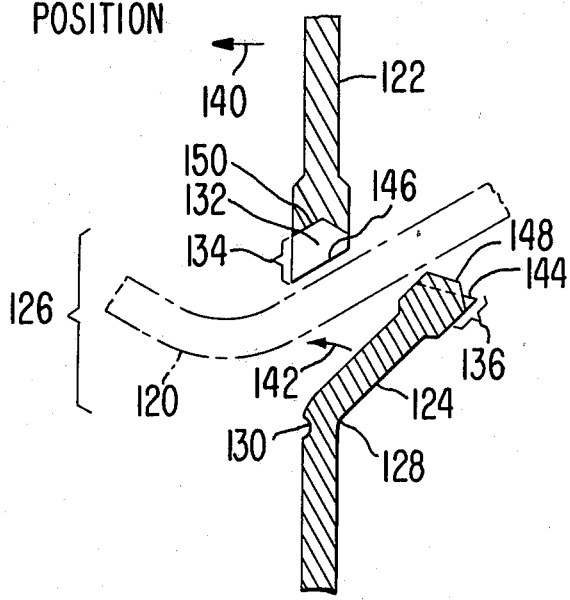
FIGS. 15a, 15b, and 15c are two cross-sectional side views and a front view of an embodiment of the present invention for anchoring an electrical cord to a stiff sheet.
Figure 15B:
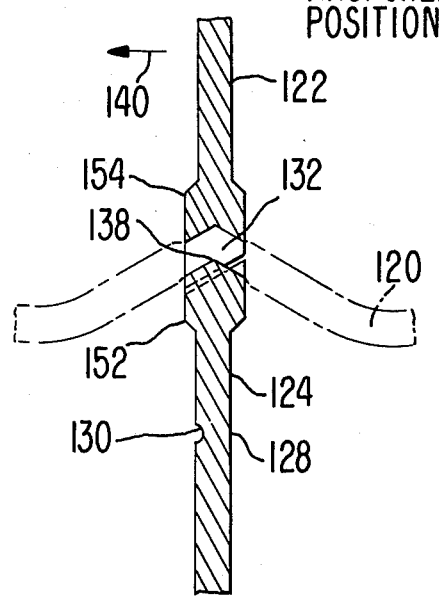
Figure 15C:
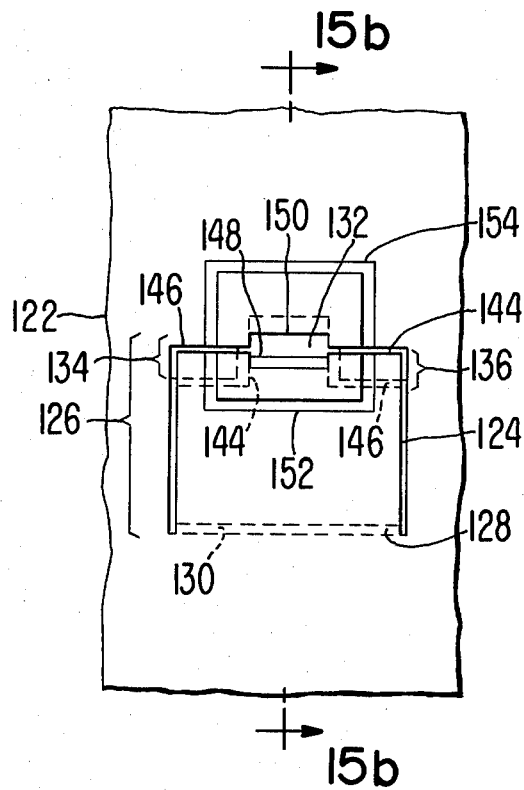

Referring to the drawings, FIGS. 15a, 15b, and 15c show two cross-sectional side views and a front view of an embodiment of the present invention for anchoring an electrical cord 120, indicated by dashed lines, to a tiff sheet 122. FIG. 15a shows cord 120 in the unanchored position with respect to sheet 120, whereas FIGS. 15b and 15c depict cord 120 in the anchored position.

Sheet 122 has a cantilevered door 124 formed in a door opening 126 in sheet 122. The area of door opening 126 is made greater than the transverse cross-sectional area of cord 120 to facilitate insertion of cord 120 through door 124 when door 124 is open. Door 124 is typically rectangular in shape.

At one door edge 128, door 124 is continuous and integral with sheet 122. That is, the same material which forms sheet 122 continues over across door edge 128 to form door 124. Door edge 128 is a pivotal axis about which door 124 can move angularly. (The term "edge" is employed in describing item 128, even though door 124 is not discontinuous with sheet 120 along item 128, because item 128 does describe an edge in terms of the physical extent of door 124. Such usage of the term "edge" facilitates description and comparison of item 128 with other edges of door 128. Item 128 is also referred to as pivotal axis 128 herein.) Since sheet 122 is a stiff material, a groove 130 is formed along pivotal axis 128 to facilitate rotation of door 124. Groove 130 may be formed on either side of sheet 120.

A notch 132 is formed in the door-opening edge 134 (of sheet 120) which, when door 124 is closed, is adjacent to the door edge 136 that is generally located on the opposite side of door 124 to pivotal axis 128. Notch 132 may be generally rectangular in shape and is usually slightly smaller in area than the transverse cross-sectional area of cord 120. When the door is closed, as shown in FIG. 15b, a selected portion 138 of cord 120 lies in notch 132.

The invention is operated by inserting cord 120 through door opening 126 when door 124 is open such that cord portion 138 which defines the proper anchoring location for cord 120 lies in notch 132. The direction of the strain or pulling forces acting on cord 120 is indicated by arrow 140. Door 124 is then rotated in the direction of curved arrow 142 as shown in the unanchored position of FIG. 15a to the final anchored position of FIG. 15b. In the anchored position, door 124 is closed with respect to sheet 122—i.e., door 124 is generally parallel to sheet 122.

To insure that door 124 remains in the anchored or closed position, interfering means are integrally formed with sheet 122 and door 124 to prevent door 124 from rotating in the direction of arrow 142 beyond the anchored position. The pulling forces are thus exerted on cord 120 from one side of sheet 122, and door 124 opens only to the other side. The interfering means comprise a first pair of slanted portions 144 formed in door edge 136 and a corresponding second pair of slanted portions 146 formed in door-opening edge 134. As indicated in FIG. 15c, one of slanted portions 144 is located on one side of notch 132, and the other of slanted portions 144 is located on the other side of notch 132. Similarly, one of slanted portion 146 is located on one side of notch 132, and the other of slanted portions 146 is located on the other side of notch 132. Each of slanted portions 144 and 146 has a sloped surface that faces inward when door 124 is closed. When cord 120 is anchored to sheet 122, the sloped surface of one of slanted portions 144 contacts the sloped surface of one of slanted portions 146, and the sloped surface of the other of slanted portions 144 contacts the sloped surface of the other of slanted portions 146. Door 124 thereby cannot rotate counterclockwise as shown in FIG. 15b beyond the anchored position.

To keep cord 120 from sliding in notch 132, friction means are integrally formed in door edge 136 and in that part of sheet 122 comprising notch 132. The friction means comprise a convex section 148 formed in a middle portion of door edge 136 and a corresponding concave section 150 formed in notch 132 directly opposite convex section 148. Convex section 148 is spaced apart from concave section 150 by the width of notch 132 in the vertical direction as viewed in FIGS. 15b and 15c. Convex section 148 and concave section 150 are each shown in the shape of a "V". When door 124 is closed, convex section 148 and concave section 150 act to distort portion 138 of cord 120 within notch 132. Cord portion 138 may also be compressed. Frictional forces are thereby created between the outside of cord 120 and the surfaces forming convex section 148 and concave section 150 so as to hold cord portion 138 within notch 132.

To strengthen the anchoring structure, regions of sheet 122 and door 124 in the vicinity of notch 132 may be made thicker than the normal thickness of sheet 122 and door 124. These thicker regions are indicated by items 152 and 154.

Sheet 122 and door 124 may be molded in plastic according to known plastic-molding methods. Typically, ABS plastic is employed in fabricating the anchoring structure. Non-plastic materials may also be used in fabricating the invention.

Whereas the anchoring structure has been described with reference to a notch formed in the stiff sheet, the invention may also be employed with a notch formed in the cantilevered door. Alternatively, the invention may be employed with notches formed both in the sheet and in the cantilevered door. Furthermore, various other types of interfering means and friction means may be employed with this invention.

D

Figure 16A:
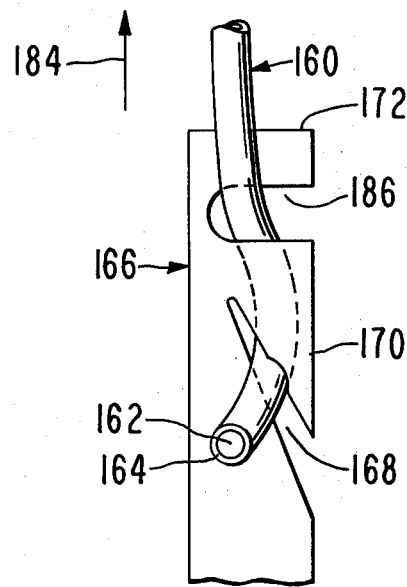
FIGS. 16a and 16b are front and side views of an embodiment of a structure to which an electrical wire is electrically connected.
Figure 16B:
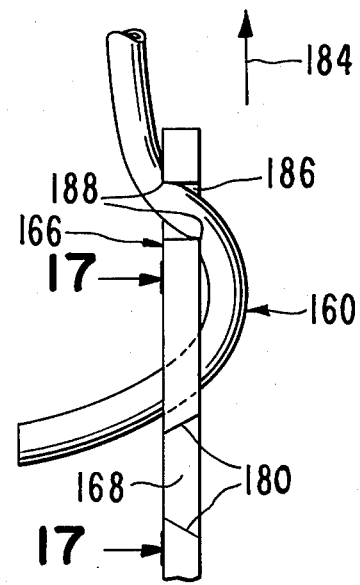
Figure 17:
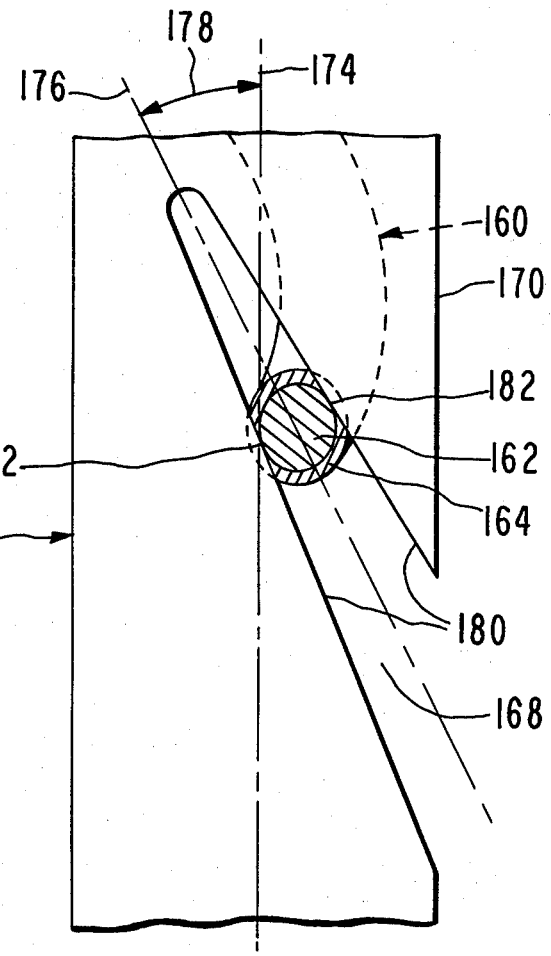
FIG. 17 is an expanded cross-sectional front view of the embodiment of FIG. 16a showing details of the electrical connection between the structure and the wire.

Referring to the drawings, FIGS. 16a and 16b show front and side views of an embodiment of a structure designed to be electrically connected to an electrical wire 160. FIG. 17 depicts an expanded cross-sectional front view of a portion of the structure shown in FIG. 16a. Portions of wire 160 that are hidden by the structure in FIGS. 16a, 16b, and 17 are indicated by dashed lines.

Wire 160 is a conventional electrical wire having an inner electrical conductor 162 extending along the length of wire 160 with an electrically insulating outer covering 164 extending along the length of wire 160 over inner electrical conductor 162. To simplify description of the invention, wire 160 is illustrated as having only a single inner electrical conductor 162 in FIGS. 16a, 16b, and 17. A wire having two or more inner electrical conductors akin to inner conductor 162 may be utilized in practising the invention.

In the structure of the invention, wire 160 is electrically connected to electrically conductive plate 166, which is generally illustrated as being of a rectangular shape. Plate 166 is typically an electrically conductive material such as copper or brass.

A slit 168 is formed in a side edge surface 170 of plate 166 at a selected displacement from the top edge surface 172 of plate 166. Slit 168 is oriented such that its mouth (and normally widest) portion is located furthest from top edge surface 172 with the inner-most (and normally narrowest) portion of slit 168 located nearest top edge surface 172. The general longitudinal axis 174 of plate 166 is angularly offset from the general longitudinal axis 176 of slit 168 by selected acute angle 178. The two edge surfaces which generally form slit 168 are designated as items 180.

Electrical contact between plate 166 and inner conductor 162 at a first position on wire 160 is made by urging wire 160 into slit 168 until inner conductor 162 contacts at least one of edge surfaces 180 forming slit 168. Inner conductor 162 may contact both of edge surfaces 180 as is the case illustrated in FIG. 17. In the embodiment shown in FIG. 17, electrical contact is made in the vicinity of points 182, where the width of slit 168 is approximately equal to the transverse cross-sectional diameter of inner conductor 162.

To enable electrical contact to be made, at least one cut must be made through outer covering 164 at the first position on wire 160 so that inner conductor 162 is appropriately exposed. In a preferred embodiment, at least one of edge surfaces 180 of slit 168 is fabricated as a knife edge. Such a construction is illustrated in FIG. 16b where both edge surfaces 180 are slanted to function as knife edges. The knife edge or edges of slit 168 cut through outer covering 164 to expose inner conductor 162 as wire 160 is urged into slit 168. Alternatively, the necessary cut or cuts into outer covering 164 may be performed with conventional cutting tools. In the resultant structure, at least one portion of the material forming edge surfaces 180 penetrates through outer covering 164 to contact inner conductor 162.

In use, wire 160 is subjected to pulling forces acting generally in the direction of arrow 184. To relieve excessive stresses created by these pulling forces and acting at the first position on wire 160 where electrical contact is made to plate 166, holding means are integrally formed in plate 166 for gripping outer covering 164 at a second position on wire 160.

The holding means shown in FIGS. 16a and 16b comprise a finger-shaped notch 186 formed in side edge surface 170 between slit 168 and top edge surface 172. The longitudinal axis of notch 186 is generally parallel to top edge surface 172. The width of notch 186 is equal to or slightly greater than the transverse cross-sectional diameter of wire 160.

Wire 160 is threaded through notch 186 as illustrated in FIGS. 16a and 16b so that outer covering 164 contacts the edge surfaces of the material forming notch 186 generally in the vicinity of points 188. Outer covering 164 is generally deformed in the vicinity of contact points 188. The frictional forces created by this deformation and acting on outer covering 164 at the second position on wire 160 oppose the external pulling forces acting in the direction of arrow 184. As a consequence, stress relief occurs in the vicinity of the first position on wire 160 where electrical contact is made between plate 166 and inner conductor 162. The positioning of notch 186 relative to slit 168 also prevents wire 160 from slipping out of slit 168.

Figure 18A:
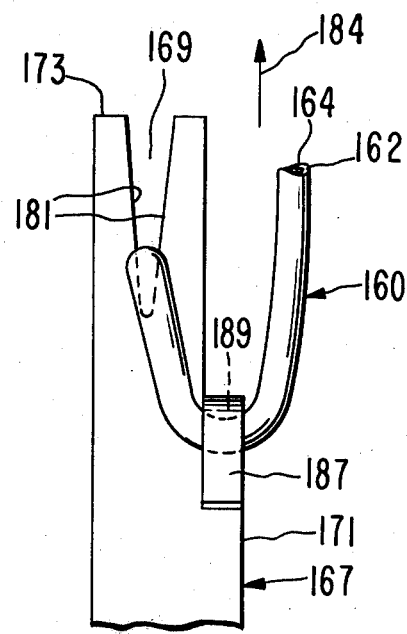
FIGS. 18a and 18b are front and side views of another embodiment of a structure to which an electrical wire is electrically connected.
Figure 18B:
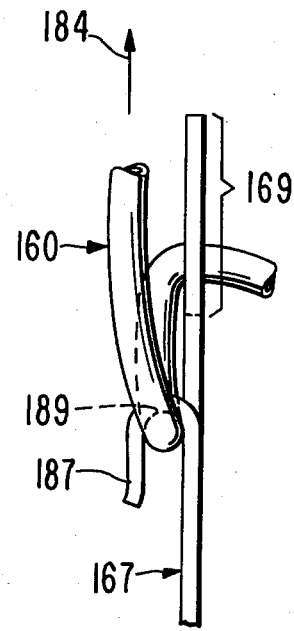

FIGS. 18a and 18b show front and side views of another embodiment of a structure designed to connect electrically to an electrical wire 160. Portions of wire 160 which are hidden by the structure are shown by dashed lines.

In this embodiment, an electrically conductive place 167 of a generally rectangular shape has a V-shaped slit 169 formed in the top edge surface 173 of plate 167. Portions of slit 169 hidden by wire 160 are shown by dashed lines. Wire 160 is inserted into slit 169 until at least one of the edge surfaces 181 forming slit 169 penetrates through outer covering 164 to make electrical contact with inner conductor 162 at a first position on wire 160. The necessary cutting through outer covering 164 to expose inner conductor 162 may be accomplished either by a knife edge formed on at least one of edge surfaces 181 or with conventional cutting tools.

In the embodiment depicted in FIGS. 18a and 18b, the holding means for relieving stress in wire 160 in the vicinity of the electrical contact comprise a hook-shaped member 187 formed in a side edge 171 of plate 167. Member 187 is located below the site where electrical contact is made between inner conductor 162 and plate 167. The U-shaped portion of member 187 is directed downward. Member 187 is fabricated integrally in plate 167 by cutting a strip of desired size in plate 167 and then bending the strip into the shape of a hook.

To accomplish the stress-relieving function, wire 160 is threaded as shown through member 187 until outer covering 164 contacts member 187 in the vicinity of point 189. Frictional forces generated by this contact act to oppose the external forces acting in the direction of arrow 184 and thus relieve stress in the vicinity of the first position on wire 160.

The electrical-connection structures of this invention are fabricated according to conventional manufacturing and machining techniques. The holding means or mechanisms are generally constructed integrally as parts of these structures. In addition, various other types of holding means may be employed in this invention.

E

While the invention has been described with reference to particular embodiments, the description is solely for the purpose of illustration and is not to be construed as limiting the scope of the invention claimed below. For example, pins or screws of various other shapes may be used instead of the standard straight pins and eccentric pins described above for effecting electrical connection between a standard printed circuit board and a conventional rectangular packaged integrated circuit. Thus, various modifications, changes, and applications may be made by those skilled in the art without departing from the true scope and spirit of the invention as defined by the appended claims.

What is claimed is:

1. In combination with a first and a second electrical device, said first device having a printed circuit pattern thereon with M lead-receiving holes passing through selected portions of said pattern and into said first device, wherein M is a positive integer greater than one, the improvement comprising:

M resilient electrical leads corresponding on a one-to-one basis to said M holes, each lead extending from said second device at least partway into the corresponding hole, the section of each lead within said corresponding hole being smaller in cross-section than said corresponding hole; and means for rigidly orienting each of said sections to cause a first surface portion of each section to contact a first portion of the surface area forming said corresponding hole and to cause a second surface portion of each section to contact a second portion of the surface area forming said corresponding hole, said first and second portions of the surface area forming said corresponding hole being spaced apart and generally opposed in vector direction to each other; said means for rigidly orienting comprising (1) a first cylindrical portion having a first end surface opposite a second end surface and (2) a second cylindrical portion having a first end surface opposite a second end surface, said cylindrical portions oriented with their longitudinal axes of rotation offset from each other and joined along the first end surfaces, said first cylindrical portion positioned at least partway through a first aperture passing at least partway through said first device and said second cylindrical portion positioned at least partway through a second aperture passing at least partway through said second device.

2. A structure as in claim 1 and further including:
means electrically connecting said pattern with at least one of said first and second portions of the surface area forming each hole.

3. In combination with a first and a second electrical device, said first device having a conductive lead line thereon extending approximately up to the edges of a lead-receiving hole in said first device and said second device having a resilient electrical lead extending therefrom at least partway into said hole, wherein the section of said lead within said hole is smaller in cross-section than said hole, the improvement comprising:
means for rigidly orienting said section to cause a first surface portion of said section to contact a first portion of the surface area forming said hole and to cause a second surface portion of said section to contact a second portion of the surface area forming said hole, said first and second portions of the surface area forming said hole being spaced apart and generally opposed in vector direction to each other; said means for rigidly orienting comprising (1) a first cylindrical portion having a first end surface opposite a second end surface and (2) a second cylindrical portion having a first end surface opposite a second end surface, said cylindrical portions oriented with their longitudinal axes of rotation offset from each other and joined along the first end surfaces, said first cylindrical portion positioned at least partway through a first aperture passing at least partway through said first device and said second cylindrical portion positioned at least partway through a second aperture passing at least partway through said second device.

4. A structure as in claim 2 and further including:
means electrically connecting said lead line with at least one of said first and second portions of the surface area forming said hole.

5. A structure as in claim 3 or 4 wherein said second cylindrical portion is greater in diameter than said first cylindrical portion.

6. A structure as in claim 5 wherein the second end surface of the second cylindrical portion has a crevice for enabling said means for rigidly orienting to be rotated along the longitudinal axes of said cylindrical portions.

7. A structure as in claim 6 and further including means joined to the second end surface of the first cylindrical portion for locking said first cylindrical portion to said first device.

8. A structure for anchoring an electrical cord to a stiff sheet comprising:
a cantilevered door formed in said sheet and continuous with said sheet at a first door edge which constitutes a pivotal axis for angular movement of said door, the door opening for said door having a notch for receiving said cord, said notch being formed in the edge of the door opening adjacent to a second door edge located generally opposite the first door edge;
interfering means integrally formed with said door and said sheet for preventing said door from rotating all the way through said door opening, thereby permitting said door to open only to one side of said sheet; and
friction means integrally formed with said door and with said sheet in said notch for anchoring said cord to said sheet when said door is in the closed position with respect to said sheet relative to pulling forces exerted on said cord from the other side of said sheet.

9. A structure for anchoring an electrical cord comprising:
a stiff sheet having a door opening larger in area than the transverse cross-sectional area of said cord for permitting said cord to pass therethrough, a notch being formed in an edge of said door opening particularly for receiving a portion of said cord;
a cantilevered door formed continuous with said sheet at a first door edge generally to occupy said door opening when said door is in the closed position with respect to said sheet, the first door edge constituting a pivotal axis for angular movement of said door and being located opposite to a second door edge which is adjacent to said notch when said door is in the closed position;
interfering means integrally formed with said door and said sheet for preventing said door from rotating all the way through said door opening, thereby permitting said door to open only to one side of said sheet; and
friction means integrally formed with said door and with said sheet in said notch for anchoring said portion of said cord to said sheet when said door is in the closed position relative to pulling forces exerted on said cord from the other side of said sheet.

10. A device for electrically connecting electrically conductive lead lines of a printed circuit pattern on a printed circuit board comprising:
an electrically conductive resilient main body for insertion into a hole passing through the thickness of the printed circuit board, said main body comprising (1) N curved electrically conductive plate sections spaced apart and generally arranged in a cylindrical pattern, where N is a positive integer greater than one, (2) N curved electrically conductive retaining protrusions corresponding on a one-to-one basis to said N plate sections, for keeping said main body from being removed from said hole, each retaining protrusion extending radially outward with respect to the cylindrical pattern beyond the corresponding plate section and each retaining protrusion being joined along its upper edge to said corresponding plate section along its lower edge, and (3) a bowl-shaped electrically conductive resilient bottom joined along its edge to said N retaining protrusions along their lower edges; and
N electrically conductive resilient arms corresponding on a one-to-one basis to said N plate sections, said N arms joined to said main body and extending outward therefrom for contacting selected conductive lead lines of the printed circuit pattern, each arm comprising (1) an electrically conductive resilient flange joined along its inner-most edge to the corresponding plate section along its upper edge and oriented generally in the radial direction with respect to the cylindrical pattern and (2) an electrically conductive contact member joined to said flange near its outer-most edge.

* * * * *